United States Patent [19]

Koenig

[11] 3,737,738

[45] June 5, 1973

[54] CONTINUOUS STRIP PROCESSING OF SEMICONDUCTOR DEVICES AND NOVEL BRIDGE CONSTRUCTION

[75] Inventor: Paul W. Koenig, Clyde, N.Y.

[73] Assignee: General Electric Company, Syracuse, N.Y.

[22] Filed: Sept. 22, 1970

[21] Appl. No.: 74,291

[52] U.S. Cl. ..........................317/234 R, 317/234 N

[51] Int. Cl. ..........................H01l 5/00

[58] Field of Search ..........................317/234, 5.4

[56] References Cited

UNITED STATES PATENTS

| | | | |
|---|---|---|---|
| 3,427,510 | 2/1969 | Schwarz et al. | 317/234 |
| 3,348,105 | 10/1967 | Doyle | 317/234 |
| 3,270,399 | 9/1966 | Ohntrup | 29/155.5 |
| 2,994,121 | 8/1961 | Shockley | 29/25.3 |

*Primary Examiner*—John W. Huckert
*Assistant Examiner*—E. Wojciechowicz
*Attorney*—Robert J. Mooney, Nathan J. Cornfeld, Carl O. Thomas, Frank L. Neuhauser, Oscar B. Waddell and Joseph B. Forman

[57] ABSTRACT

Two continuous lead strips are advanced longitudinally to receive a semiconductor element therebetween. The semiconductor element is attached to the strips, the semiconductor element is encapsulated, and the strips are segmented to form a semiconductor device. The strips may be fed in side by side or transverse relation. To form a bridge two strips are fed in side by side relation while two more strips are fed in transverse relation to the first two and in side by side relation to each other.

3 Claims, 6 Drawing Figures

INVENTOR:
PAUL W. KOENIG,

BY [signature]
HIS ATTORNEY.

INVENTOR:
PAUL W. KOENIG,
BY Carl O. Thomas
HIS ATTORNEY.

CONTINUOUS STRIP PROCESSING OF SEMICONDUCTOR DEVICES AND NOVEL BRIDGE CONSTRUCTION

My invention relates to a process for the manufacture of semiconductor devices and bridges and to a novel semiconductor bridge construction.

It has long been recognized that fabricating semiconductor devices one at a time by hand increases their cost to the point of rendering them prohibitively expensive for many commercial applications. Accordingly, techniques have heretofore been developed for forming many device components from unitary elements which are sub-divided only after fabrication is completed. This permits a number of devices to be formed simultaneously with considerably less handling than is required to fabricate the same number of devices individually. For example, it is conventional practice simultaneously to mount eight or more semiconductor pellets on a lead frame and to sub-divide the lead frame after fabrication of the devices is otherwise completed. Still another approach, similar to the lead frame approach, has been sequentially to form multiple semiconductor devices along a common carrier strip and subsequently to remove selected portions of the carrier strip to form multiple devices.

While the common lead frame and continuous carrier strip approaches have reduced device fabrication costs, they have nevertheless continued to pose significant fabrication disadvantages for many applications. For example, while the above approaches work well for attaching one or more leads simultaneously to a single semiconductor pellet face, as encountered in planar pellet applications, lead attachment to a remote face of the semiconductor pellet in most cases is little changed from one at a time device fabrication techniques. Delineation of the lead pattern is typically wasteful of metal and frequently relieved areas of somewhat complicated geometries must be formed in order to define the desired lead patterns. The leads are seldom associated with the pellets in such a manner as to allow efficient heat transfer to the leads. Further, the leads are frequently restricted in size so that their power handling and heat dissipating capabilities are limited.

It is an object of my invention to provide a process whereby semiconductor devices requiring efficient heat dissipation through their leads may be fabricated at low cost through more effective manipulation and less waste of lead stock while using simple lead stock geometries.

It is a more specific object of my invention to apply my process to the formation of bridges.

It is another object of my invention to provide a bridge configuration which can be fabricated at low cost, which avoids a proliferation of elements and which is nevertheless capable of efficient heat dissipation through its leads.

In one aspect my invention is directed to a process for producing semiconductor devices comprising preconditioning a plurality of semiconductor pellets and two longitudinally extended lead strips to facilitate the formation of low impedance ohmic connections therebetween. The semiconductor pellets are located at longitudinally spaced intervals between the two lead strips. The lead strips are compressively associated with the semiconductor pellets while holding the adjacent portions of the lead strips longitudinally in tension. Simultaneously the semiconductor pellets are compressively associated with and bonded to the adjacent tensioned portions of the lead strips. Thereafter the semiconductor pellets are encapsulated and a segment is severed from each of the lead strips so that at least one encapsulated semiconductor pellet is associated with the segments.

In another aspect, my invention is directed to a bridge comprised of first and second lead strip segments arranged in spaced side by side relation to form a first lead strip segment pair. Third and fourth lead strip segments are arranged in spaced side by side relation to form a second pair, both of the lead strip segments of the first pair crossing both of the lead strip segments of the second pair. A first semiconductor pellet lies between and is attached to the first and third lead strip segments at their crossing. A second semiconductor pellet lies between and is attached to the first and fourth lead strip segments at their crossing. A third semiconductor pellet lies between and is attached to the second and third lead strip segments at their crossing. A fourth semiconductor pellet lies between and is attached to the second and fourth lead strip segments at their crossing. Each of the semiconductor pellets attached to the first lead strip segment includes a zone of a first conductivity type lying adjacent the first lead strip segment, and each of the semiconductor pellets attached to the second lead strip segment includes a zone of an opposite conductivity type lying adjacent the second lead strip segment. Encapsulating means lies at the crossings of the lead strip segments and surrounds each of the semiconductor pellets.

My invention may be better understood by reference to the following detailed description considered in conjunction with the drawings, in which FIG. 1 is a schematic flow diagram;

Figures 3, 4, 5:
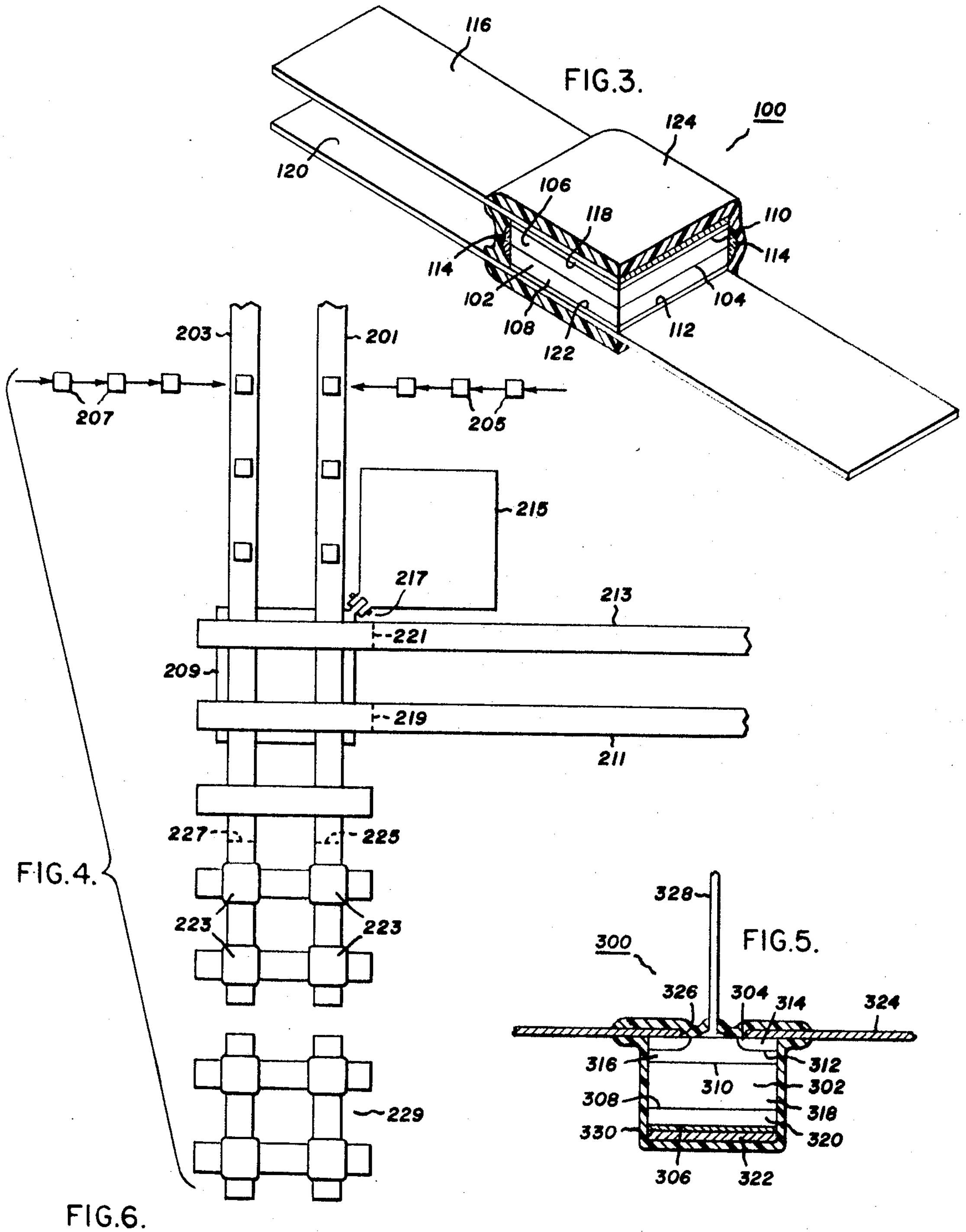
FIG. 3 is an isometric view of a semiconductor device fabricated according to my process, portions of the encapsulating and passivating layers being broken away.
FIG. 4 is a schematic plan view of an assembly line for building bridges according to my teachings.
FIG. 5 is a vertical section through a gate controlled semiconductor device formed according to my teachings.

In FIGS. 3 and 5 the thickness of the semiconductor pellets is exaggerated for ease of illustration.

In the practice of my invention I utilize as starting materials at least two strips which are later segmented to form individual device leads. The strips are of such extended length that in their longitudinal dimensions they may be considered continuous as compared to individual device lead lengths required. The strips are of limited width and thickness. In the preferred form the strips are formed so that their width clearly exceeds their thickness, as in a ribbon, tape, fillet, band, etc. The strips exhibit at least one surface which is flat across the strip width. Although not preferred, the strips may be only intermittently flattened at intervals corresponding to the intervals at which semiconductor pellets are to be attached. Where the strips take the form of a ribbon or tape as preferred it is appreciated that they offer superior heat dissipation characteristics since the ratio of the surface area to the cross-sectional area is greatly increased. At the same time this configuration allows retention of large cross-sections required for low impedance current conduction even though the thickness is relatively thin. The ribbon configuration is also advantageous in that the strips may be formed so that they are quite strong longitudinally, quite inflexible to edge applied forces, and yet flexible to forces applied to their faces—that is, normal to their edges. The strips may be formed of one or a combination of highly thermally and electrically conductive metals of a type conventionally utilized in semiconductor device leads. In their preferred form the strips are unitary metal bodies. The strips may, if desired, be associated with dielectric coatings or substrates, although at least one face of each strip must remain exposed.

Figure 1:
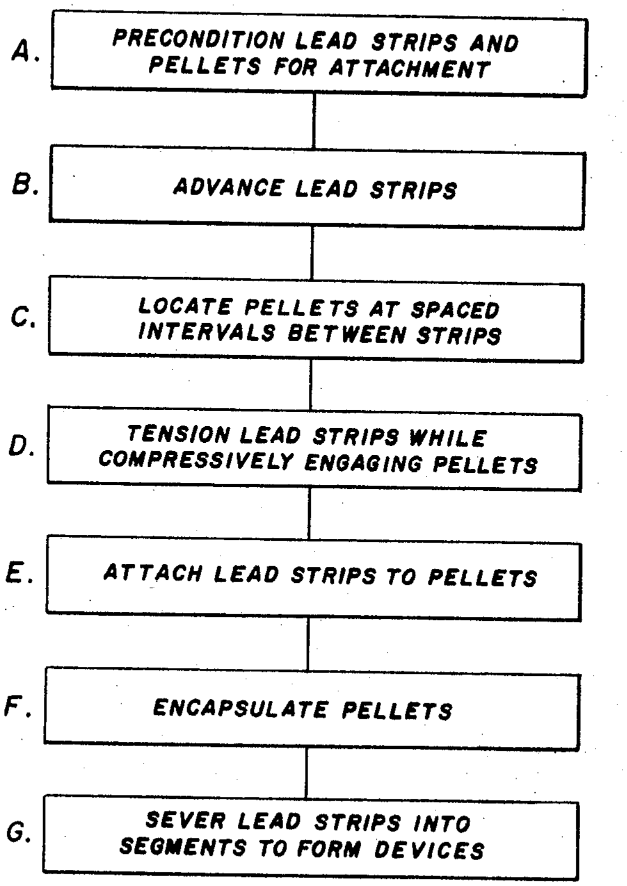

The first step of my process, indicated as Step A in FIG. 1, is to precondition the semiconductor pellets and the lead strips to be joined thereto. This may include any one or a variety of conventional processing steps intended to protect the semiconductor pellets from contaminants, to increase the physical strength of the bonds, between the pellets and the lead strips, and/or to reduce the internal resistance of the ohmic attachments between the pellets and the lead strips. Typically both the pellets and lead strips are surface etched to remove accumulated oxides and rinsed thoroughly to remove residual surface contaminants. The surfaces of the semiconductor pellets to be bonded to the lead strips are typically provided with one or more contact layers to faciliate bonding. Solder layers may next be positioned to overlie the contact layer or layers. Alternately, a solder layer may be formed on each strip face to be associated with the semiconductor pellets. One convenient technique which may be utilized is to dip coat the lead strips with solder. Since solder tends to oxidize when left standing in the air, thereby reducing its effectiveness as a bonding material, it is anticipated that the lead strips may be dip soldered as they are being longitudinally advanced, as indicated by Step B, preparatory to pellet association with the lead strips. Other steps preliminary to soldering could also be performed as the lead strips are being longitudinally advanced. It is, of course, recognized that where the solder is protected from contaminants and/or surface cleaned immediately prior to use the lead strips may be solder coated substantially in advance of device fabrication. For example, the lead strips may be purchased commercially with the solder layers already associated therewith. It is recognized that other conducting bonding materials, such as solder preforms and metal loaded resins, may be substituted for solder coating, if desired.

According to Step C, FIG. 1, the lead strips are advanced longitudinally and associated with the semiconductor pellets in such a manner that the pellets are located at longitudinally spaced intervals. A preferred technique for accomplishing this is to longitudinally feed one lead strip at a fixed rate of advance beneath a dispenser which drops semiconductor pellets onto the lead strip at fixed time intervals. This results in a regular, longitudinal spacing of the semiconductor pellets on the lead strip that can be controlled either by controlling the rate at which the pellets are dispensed or the rate at which the lead strip is fed. A second lead strip can then be fed to overlie the pellet contact surface remote from the first lead strip. This preferred arrangement can be better appreciated by reference to FIG. 2. A first lead strip 1 is advanced longitudinally by unwinding from a storage spool 3. A semiconductor pellet dispenser 5 of conventional type schematically shown deposits semiconductor pellets 7 onto the first lead strip. A second lead strip 9 is continuously fed from a second storage spool 11 and advanced at the same rate as the first lead strip. The second lead strip engages the contact surfaces of the pellets remote from the first lead strip. Instead of automatically dispensing the pellets, they could be placed by hand and the dispenser eliminated. Instead of regularly spacing the pellets along the strips, the pellet spacing may be varied at will. Usually the pellet spacing is dictated by the length of the leads desired on the finished product. Instead of dispensing the pellets so that they are conveyed by one strip and then associated with the remaining strip, the pellets may be simultaneously associated with both lead strips. A separate conveyor may be utilized to locate the pellets between the lead strips. The advantages of the preferred dispensing arrangement are that one strip acts as a conveyor for the pellets. By suitably positioning the tape so that it is fed horizontally the pellets can be readily centered with respect to the width of the lead strips. Finally, by delaying association of the second lead strip until after the pellets are positioned, an opportunity is provided for visual inspection of pellets immediately prior to bonding which can allow mechanically defective pellets to be detected and replaced or removed.

As the lead strips are further longitudinally advanced toward the location at which they are positively bonded to the associated semiconductor pellets, it is desirable to minimize relative shifting of the pellets and lead strips by holding the lead strips in tension along their longitudinal axis while applying compressive forces normal to the outer faces of the lead strips, as indicated by Step D, FIG. 1. The longitudinally applied tension minimizes any tendency of the lead strips to depart from their desired parallel alignment. For example, pulling the strips in tension can avoid any tendency of the lead strips to exhibit residual bowing resulting from spool winding, kinking, etc. The compressive engagement of the lead strip faces with the contact surfaces of the pellets increases their frictional engagement avoiding lateral shifting of the pellets.

While maintaining the lead strips and pellets in this desired relationship, bonding of the pellets to the strips can be achieved, as indicated by Step E in FIG. 1. Where the lead strips and pellets are to be heated in order to achieve bonding, as in the case of soldering, elements may be associated with the outer faces of the lead strips to both apply compression and heat to the lead strips for soldering. Where a resin loaded with conductive material is utilized as a bonding agent, the heated element may act to accelerate setting of the resin. In most instances it is desirable that bonding take place in an inert or reducing atmosphere, such as nitrogen, hydrogen, argon, etc., in order to minimize oxidation of the solder upon heating. Accordingly, it is anticipated that the lead strips may be longitudinally advanced through a conventional tunnel oven while the pellets and lead strips are held in the desired relationship. The tunnel oven approach is particularly advantageous in that it allows for accurate control of heating prior to and cooling subsequent to bonding.

Figure 2:
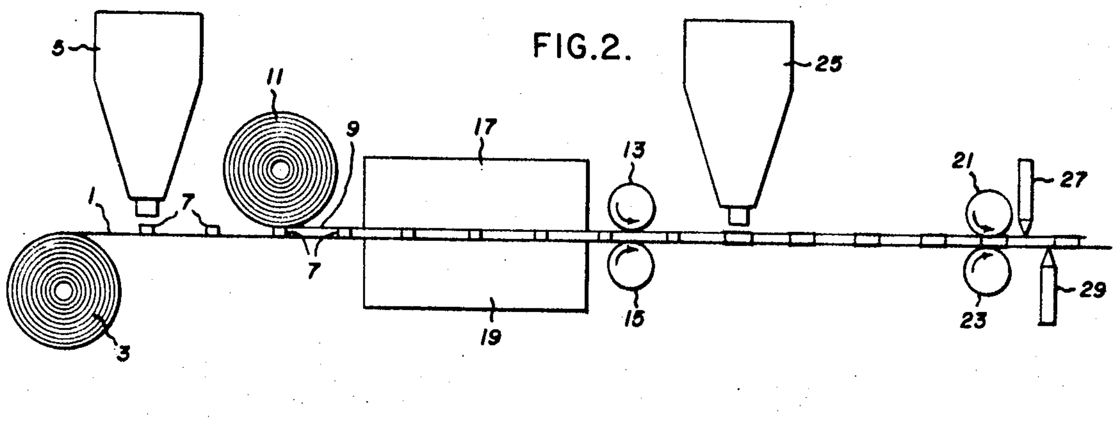
FIG. 2 is a schematic representation of an assembly line for practicing my process.

To illustrate the performance of Steps D and E, it can be seen in FIG. 2 that the opposed rolls 13 and 15 compressively engage the outer faces of the lead strips and when rotated in the direction indicated by the arrows shown thereon, pull the lead strips forward. The amount of tension which is applied longitudinally by the rolls is controlled by the drag of the spools. By controllably increasing the drag associated with the spools using known techniques the tension applied to the lead strips between the rolls and the spools can be readily adjusted. Heating platens 17 and 19 are shown compressively and slidably associated with the outer faces of the upper and lower lead strips, respectively. The platens may be located in a tunnel oven, not shown. Instead of using platens to heat the lead strips, it is appreciated that conventional radiant, inductive, or convective heating arrangements could be substituted, although separate provision would in these cases be required to apply compression to the strip faces.

Noting Steps F and G in FIG. 1, after the pellets are bonded to the lead strips, the lead strips may be further longitudinally advanced to allow the pellets to be protectively encapsulated. The lead strips with the encapsulated pellets attached may be sub-divided into segments to form the individual semiconductor devices. This is broadly illustrated in FIG. 2 in which the rolls 21 and 23 upon rotation in the direction indicated by the arrows thereon, pull the lead strips with the pellets attached beneath an encapsulant dispenser 25, schematically shown. Further advancement of the lead strips longitudinally with the encapsulant associated brings the lead strips into proximity with lead shearing elements 27 and 29.

In a very simple approach to encapsulation a conventional semiconductor potting resin, such as an epoxy, silicone, or phenolic resin, may be dispensed so that it covers the exterior surfaces of each receiving pellet that remain exposed after bonding. The resin can be suitably cured as the lead strips are advanced away from the dispenser employing conventional techniques. One approach which I prefer for encapsulation is to associate the encapsulant with the pellets by passing the lead strips with the pellets bonded thereto through a fluidized bed of encapsulant material.

While in most instances it is preferred that final encapsulation of the pellets be undertaken after bonding of the pellets to the lead strips, I recognize that in many instances it may be desirable to associate the dielectric encapsulant partially or entirely with the pellet prior to bonding for the purpose of protecting the pellets during prior handling and fabrication steps. As an example, the pellets 7 may leave the dispenser 5 already provided with an annular passivant layer lying between the surfaces of the pellets to be associated with the lead strips. Where the passivant layer is itself of rugged construction, as is typical of thick glass passivant layers, no other dielectric encapsulant may be required. Another alternative approach employable is to apply a passivant to the pellets after bonding. A separate encapsulant usually will additionally be applied to cover and protect the passivant.

In FIG. 3 the semiconductor device 100 illustrated is exemplary of devices fabricatable according to my process. The device is comprised of a semiconductor pellet 102 having four orthogonal edges intersected by a junction 104 separating a zone 106 of N conductivity type from a zone 108 of P conductivity type. The junction is generally parallel to a first major surface 110 and a second major surface 112. In the form shown the pellet is of uniform cross-sectional area between the first and second major surfaces. In actual practice some variation may be present in the pellet cross-section between the opposed major surfaces, depending upon the technique used to form the pellet. For example, where the pellet is formed by grit blasting or by etching some variation in cross-section of the pellet will be present. In other instances it may be desired pruposely to bevel the edges of the pellet in order to reduce the surface field gradients along the edges. Despite these variations in cross-section, however, the cross-sectional areas of the major surfaces will approximately correspond to each other and to the cross-sectional area of the pellet in a plane taken parallel thereto. This maximizes the cross-sectional areas of the major surfaces relative to that of the pellet. It is also to be noted that the junction by intersecting the pellet edges rather than a major surface leaves the major surfaces of a single conductivity type. A glass passivant layer 114 is shown overlying the edge intersections of the junction.

A first lead 116 is attached in low impedance electrically and thermally conductive relation to the first major surface by a bonding layer 118. A second lead 120 is similarly attached to the second major surface through a bonding layer 122. While for simplicity the bonding layers are shown as unitary, it is appreciated that in most instances each bonding layer is comprised of one or more layers of solder or other bonding material together with one or more contact metal layers associated with the semiconductor pellet and/or leads to facilitate soldering thereto. The leads are shown to be of a width at least equalling that of the semiconductor pellet. This insures a broad area of contact between the semiconductor pellet and each lead, allowing for efficient current and heat conduction. At the same time the leads are relatively thin so that they can be easily flexed to meet device mounting requirements. In the form shown both leads extend laterally beyond the semiconductor pellet in two directions. For most common applications it will be desired to have each lead extend from the semiconductor pellet in one direction only, usually with the leads extending in opposite directions. These lead relationships can be easily obtained, for example, merely by controlling the relative positioning of the lead shearing elements 27 and 29. In FIG. 2 the lead shearing elements are relatively positioned so that one lead strip is cut adjacent one semiconductor pellet while the remaining lead strip is segmented next to an adjacent semiconductor pellet. This results in the production of semiconductor devices similar to device 100, but with the leads extending in opposite directions. To allow the leads to extend in both directions it is merely necessary vertically to align and to center the shearing elements between adjacent elements. To allow the leads to extend to one side of the attached pellet only the shearing elements are located in vertical alignment and cut closely adjacent to one semiconductor pellet. It is to be noted as a significant feature of my invention that in none of the above instances is it necessary to waste any portion of the lead strips in order to achieve the desired lead pattern, nor is it necessary that any complicated pattern of shearing be utilized.

A housing for the semiconductor device 100 is formed by the encapsulant 124. While the encapsulant is shown overlying the outer faces of the leads, it is appreciated that this is not necessary, since the leads themselves adequately protect the semiconductor pellet over these areas. In this connection it is noted that where the glass passivant layer 114 is formed of sufficiently rugged construction, the encapsulant may be omitted entirely. The glass passivant layer and the bonding layers may together cover the entire exterior surface of the pellet and obviate the need of any additional encasement.

While I have described my process with reference to the formation of semiconductor devices having their leads, as formed, lying along parallel longitudinal axes, it is also my recognition that continuous lead strips may be utilized in the formation of devices in which one lead crosses or traverses another. The application of my process in this manner is best appreciated by reference to FIG. 4. Continuous lead strips 201 and 203 are shown located in side by side relation. The lead strips are advanced longitudinally, and semiconductor pellets 205 and 207 are located thereon at approximately equally spaced intervals. The pellets 205 and 207 may be identical, but they are oriented oppositely. That is, whereas the pellets 205 may have an N type conductivity zone adjacent the lead strip 201, the pellets 207 would have a P type conductivity zone adjacent the lead strip 203.

The pellets are advanced along with the strips 201 and 203 so that they overlie a bonding platen 209. Once in position lead strips 211 and 213 are advanced longitudinally in side by side relation to cross over the lead strips 201 and 203. Each of the lead strips 211 and 213 overlies one pellet located on each of the pellets associated with each of the lead strips 201 and 203. Thus, one pellet lies at each of the four crossings of the two pair of lead strips. In the exemplary form shown in FIG. 4 a cooperating platen 215 is rotated about a hinge 217 to compress the semiconductor pellets between the strips. At the same time the strips are preferably held in tension. As an alternative to tensioning strips the platens may be relied upon to remove any substantial bowing from the strips. In many instances it may be convenient to hold the strips 201 and 203, which are aligned with the direction of advance, in tension, whereas it may be relatively inconvenient to hold the remaining pair of lead strips which are not aligned with the path of advance in tension.

To permit further advancement of the lead strips 201 and 203 after the lead strips 211 and 213 are attached, the latter pair of lead strips is segmented as indicated by dashed lines at 219 and 221. Thereafter the lead strips 201 and 203 are advanced with the segments of the lead strips 211 and 213 attached to permit encapsulant 223 to be provided at each crossing of the lead strips. The lead strips 201 and 203 may then be subdivided as indicated at dashed lines 225 and 227 to form a completed bridge 229.

The bridge is of simple construction, since the four leads produced from the lead strips act both to form internal bridge connections between pellets and also to provide external leads for the bridge. The leads also laterally space the pellets and due to their relatively large ratio of surface area to cross-sectional area are capable of efficiently dissipating heat from the pellets. The use of four separate bodies of encapsulant each located at a crossing of the strips minimizes the amount of encapsulant required and leaves the central portions of the leads exposed for more efficient heat transfer. While each strip is shown to extend laterally beyond the bridge on two opposite sides, it is appreciated that the lead lengths can be modified to meet the specific bridge mounting application encountered similarly as previously described in connection with the semiconductor device 100.

Except for the differences discussed, the bridge 229 may be fabricated in generally the same manner as noted in connection with FIGS. 1 through 3 inclusive. It is to be observed that the specific fabrication approach shown in FIG. 4 is not limited to use in fabricating semiconductor bridges. By omitting the lead strip 203 and the pellets 207 associated therewith semiconductor devices may be formed differing from those formed by the procedures described by reference to FIGS. 1 through 3 inclusive only by having one lead rotated so that its longitudinal axis does not lie along the path of advancement or in approximately parallel relation to the longitudinal axis of the remaining lead.

While I have described my invention with reference to two terminal, single junction semiconductor elements, it is appreciated that other semiconductor elements may be employed as well. For example, in place of the semiconductor element 102 a three layer, two junction element of a type conventionally employed in diacs could be substituted. Similarly, a four layer, three junction semiconductor element of the type conventionally incorporated in Shockley diodes could be substituted.

My invention is also directly applicable to the fabrication of semiconductor devices incorporating control leads, such as base leads for transistors and gate leads for thyristors. An exemplary device incorporating a control lead which can be fabricated according to my invention is shown in FIG. 5. The thyristor 300 includes a semiconductor element 302 having first and second major surfaces 304 and 306. The semiconductor element is provided with an emitter junction 308 and a collector junction 310 which are generally parallel to the opposed major surfaces. A second emitter junction 312 is provided with a major portion generally parallel to the opposed major surfaces, but the second emitter junction curves upwardly at its inner edge to intersect the major surface 304. Thus the second emitter junction defines an emitter layer 314 lying between it and the first major surface. A base layer 316 lies between the collector junction and the emitter layer 312. The base layer 316 also extends to the first major surface centrally of the junction 312. A base layer 318 is located between the collector junction and the emitter junction 308 while a second emitter layer 320 is located between the emitter junction 308 and the second major surface.

A lead 322 which may be identical to those previously disclosed is shown attached to the second major surface. A lead 324 is shown attached to the portion of the first major surface formed by the emitter layer 314. The lead 324 is identical to those previously described, except that it is provided with a centrally relieved portion or aperture 326. A control lead 328 extends through the aperture to the portion of the base layer adjacent the first major surface. An encapsulant 330 is shown enclosing the semiconductor element together with the portions of the leads attached thereto. In the form shown the top and bottom leads are oriented in a crossing or perpendicular relation rather than a parallel relation.

The same techniques may be utilized to form the semiconductor device 300 as have been discussed above. Additionally it is necessary that the lead strip forming the lead 324 be relieved at spaced intervals corresponding to the spacing of the semiconductor elements. After device fabrication, but before encapsulation, the control leads may be attached to the semiconductor elements bonded to the lead strip using conventional lead bonding techniques.

Figure 6:
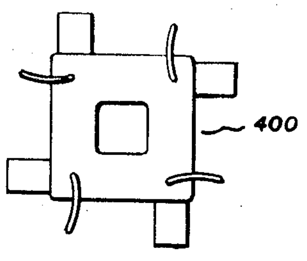
FIG. 6 is a plan view of a bridge according to my teachings.

Using the bridge forming techniques discussed with reference to FIG. 4 a bridge of control leaded semiconductor devices may be readily formed. For example, FIG. 6 shows bridge 400 comprised of four thyristors each of which may be formed identically to thyristor 300. A single body of encapsulant encloses the four thyristors and the inner portions of the bridge leads associated therewith leaving four control leads and four extensions of the leads exposed. Except for the differences specifically noted the bridge 400 is formed generally similarly as the bridges 229.

Instead of forming control lead devices according to my invention so that the control lead is attached centrally through an operture by conventional techniques, it is recognized that devices may be formed so that the control area of each semiconductor element lies adjacent an edge. In such case a relieved portion may be formed in the adjacent major current carrying lead along an edge thereof. The control lead may then be fed to the relieved portions of the lead strips laterally from a continuous lead stock. In this way control leads are attached to the semiconductor devices with the same ease and advantages as attaching transversely oriented main current carrying leads.

While I have disclosed my invention with reference to certain preferred embodiments, it is appreciated that numerous variations will readily occur to those skilled in the art to which my invention is disclosed. It is accordingly intended that the scope of my invention be determined by reference to the following claims.

What I claim and desire to secure by Letters Patent of the United States is:

1. A full wave semiconductor rectifier bridge comprising first and second longitudinally extending straight lead strip segments of generally rectangular and uniform cross-section arranged in spaced side by side generally parallel relation to form a first lead strip segment pair of which one lead strip segment includes a first power supply connection portion adapted to be connected to a one terminal of a single phase alternating current power supply and the other lead strip segment includes a second power supply connection portion adapted to be connected to the other terminal of such power supply, third and fourth longitudinally extending straight lead strip segments of generally rectangular and uniform cross-section arranged in spaced side by side generally parallel relation to form a second lead strip segment pair of which one lead strip segment includes a first load-connection portion adapted to be connected to one side of a DC load and the other lead strip segment includes a second load-connection portion adapted to be connected to the other side of such DC load, both of said lead strip segments of said first pair crossing both of said lead strip segments of said second pair, a first semiconductor P/N junction diode lying between and attached to the major faces of said first and third lead strip segments at their crossing, a second semiconductor P/N junction diode lying between and attached to the major faces of said first and fourth lead strip segments at their crossing, a third semiconductor P/N junction diode lying between and attached to the major faces of said second and third lead strip segments at their crossing, a fourth semiconductor P/N junction diode lying between and attached to the major faces of said second and fourth lead strip segments at their crossing, each of said semiconductor pellets attached to said third lead strip segment including a zone of a first conductivity type lying adjacent said third lead strip segment, each of said semiconductor pellets attached to said fourth lead strip segment including a zone of an opposite conductivity type lying adjacent said fourth lead strip segment, and respective individual encapsulating means lying at the crossings of said lead strip segments and surrounding each of said respective semiconductor diodes.

2. A bridge according to claim 1 in which said semiconductor diodes have flat end portions approximating the maximum active current carrying cross-sectional areas of the individual diodes, said lead strip segments are flat ribbons of a width greater than that of said end portions, and each of said flat end portions is in its entirety provided with a low thermal and electrical impedance ribbon attachment.

3. A bridge according to claim 1 in which said encapsulating means is comprised of plastic encapsulant associated with said semiconductor pellets.

* * * * *